United States Patent [19]
Shiraishi

[11] Patent Number: 5,801,816
[45] Date of Patent: Sep. 1, 1998

[54] PROJECTION EXPOSURE APPARATUS

[75] Inventor: Naomasa Shiraishi, Urawa, Japan

[73] Assignee: Nikon Corporation, Tokyo, Japan

[21] Appl. No.: 814,766

[22] Filed: Mar. 10, 1997

[30] Foreign Application Priority Data

Mar. 11, 1996 [JP] Japan .................................. 8-052730

[51] Int. Cl.$^6$ .................................................. G03D 27/42
[52] U.S. Cl. ............................................. 355/53; 355/67
[58] Field of Search ................................ 355/43–45, 53, 355/77, 67; 356/398–401; 250/548, 566

[56] References Cited

U.S. PATENT DOCUMENTS

| | | | |
|---|---|---|---|
| 4,711,567 | 12/1987 | Tanimoto | 355/53 |
| 4,739,373 | 4/1988 | Nishi | 355/53 |

*Primary Examiner*—D. Rutledge
*Attorney, Agent, or Firm*—Chapman and Cutler

[57] ABSTRACT

A projection exposure apparatus includes a projection optical system which projects an image of a pattern formed on a mask on a substrate. The projection optical system has a first optical system for forming an intermediate image of the pattern, a first mirror disposed near the intermediate image for deflecting a light beam from the first optical system, and a second optical system for condensing the light beam from the first mirror and forming the image of the pattern on the substrate. The first optical system and the second optical system are subject to an aberration correction with respect to a first wavelength for exposure. A second mirror is disposed near the first mirror and corrects at least a portion of a chromatic aberration generated in the first optical system and the second optical system with respect to a second wavelength different from the first wavelength. A detecting system detects a positional relationship between a mark of the mask and a mark of the substrate with a light beam at the second wavelength through the first optical system, the second optical system, and the second mirror.

20 Claims, 4 Drawing Sheets

PROJECTION EXPOSURE APPARATUS

BACKGROUND OF THE INVENTION

1. Field of the Invention

The present invention pertains to a type of projection exposure apparatus for exposing a mask pattern on a photosensitive substrate in a photolithography process. Such a process is used for manufacturing semiconductor elements, liquid-crystal display elements, pickup elements (CCDs), or film-type magnetic heads.

2. Description of Related Art

In a photolithographic process for manufacturing semiconductor elements, liquid-crystal display elements, pickup elements (CCDs, etc.), or film-type magnetic heads, a projection exposure apparatus, such as a "stepper", is used for transferring the image of a pattern formed on the reticle as a mask onto a wafer or glass plate coated with a photoresist. The transfer operation is performed by a projection optical system. In order to enlarge the pattern without increasing a load on the projection optical system, a step-and-scan method, in which an exposure is taken with synchronized scanning of the reticle and wafer with respect to the projection optical system, has been adopted.

In a projection exposure apparatus, the illuminating light emitted from a light source, such as an excimer laser with a wavelength of 248 nm or 193 nm, typically passes through a shaping lens, an illuminating field stop (reticle blind), a condenser lens, mirrors, and so on. The light is irradiated on a reticle held on a reticle stage. The imaging light beam passes through the reticle, goes through a projection optical system, which has been optimally corrected for aberrations, and exposes the wafer to an image of the reticle pattern.

In such a projection exposure apparatus, before the exposure operation, it is necessary to align the reticle and the wafer very precisely. In order to perform this alignment, an alignment mark is formed on the wafer, as a position detection mark, during a preceding operation step. By detecting the position of this alignment mark, it is possible to detect the correct position of the wafer or, more particularly, the circuit pattern on the wafer.

There are three primary alignment method types. The first of these types is one in which an alignment microscope or other alignment sensor, entirely separated from the projection optical system, is utilized. Such an alignment sensor is used to perform position detection of the alignment mark and is referred to as an "off-axis" type of sensor. Usually, in order to prevent exposure of the photoresist on the wafer to be exposed, the wavelength of the light beam for alignment is kept in a region to which the photoresist is insensitive. Such a wavelength is typically 550 nm or longer. In an off-axis type sensor, it is possible to make use of an optical system optimized to the alignment wavelength with respect to the alignment sensor. Consequently, it is possible to realize a detection system which is free from the chromatic aberration problems which will be mentioned below. However, the alignment sensor is entirely separate from the projection optical system. Due to certain factors, such as thermal expansion caused by changes in the temperature of the body of the projection exposure, the relative positions of the projection optical system and the alignment sensor will vary. This leads to alignment errors.

The other two alignment method types make use of the projection optical system itself as a portion of the alignment sensor optical system. The other methods utilize a TTL (Through-the-Lens) type alignment sensor and a TTR (Through-the-Reticle) type alignment sensor, respectively.

2

In the TTL type alignment sensor, alignment is performed by using the projection optical system as the optical path of the light beam at the alignment wavelength. Detection is performed without the aid of the reticle, however, and the light beam is guided outside the imaging optical path by curved mirrors and so on.

When using the TTR type alignment sensor, an alignment mark on the reticle and an alignment mark on the wafer are optically superimposed (imaged). Detection is performed directly. Consequently, the optical path of the light beam at the alignment wavelength goes through the reticle.

In an alignment operation using the TTL and TTR alignment sensor types, with the projection optical system itself used as a portion of the optical system of the alignment sensor, detection is carried out by using the projection optical system after optimizing with respect to the imaging light beam (ultraviolet light). As a result, chromatic aberration becomes a problem for the projection optical system at the alignment wavelength.

Efforts have been made to correct for chromatic aberration. Such efforts include the addition of a chromatic correcting part for the light beam at the alignment wavelength in the projection optical system and performing correction for chromatic aberration on the light beam as it is guided outside of the imaging light beam of the pattern by using a bent mirror. Since the projection optical system itself is used as a part of the optical system of the alignment sensor, adverse influences due to thermal expansion and so on become very small. It is possible to realize alignment with high precision and high stability.

When alignment is performed using an off-axis type sensor or a TTL type alignment sensor, it is necessary to measure a baseline. The baseline indicates a relationship between the projected position of the image, at the exposure wavelength of the pattern formed on the reticle and the position of the detection center of the alignment sensor. The error in this measurement becomes an error in alignment. In addition to alignment using the off-axis type sensor, for alignment using the TTL type alignment sensor, variation in the measurement data may take place after baseline checking.

With regard to alignment using the TTR type alignment sensor, since the alignment mark on the wafer is directly detected with respect to the alignment mark on the reticle, the alignment is immune to influences from various sources of error which accompany the alignment. This type of sensor can be regarded as having the highest precision.

Alignment can be performed by using the TTR type alignment sensor to correct for the aberration of the projection optical system while an exposure wavelength is in the UV region. However, in this case, for an alignment light beam with wavelength of 550 nm or longer, a chromatic aberration correction element is mandatory. This is inconvenient.

Conventional chromatic aberration correction not only affects the aberration correction of the alignment light beam, but also exacerbates the aberration of the imaging light beam. In addition, since there is a tendency to use shorter wavelengths for exposure as the pattern of the semiconductor IC becomes finer, the difference in wavelength between the imaging light beam and the alignment light beam increases even further. It becomes even more difficult, therefore, to perform the chromatic aberration correction.

SUMMARY OF THE INVENTION

The primary object or purpose of the present invention is to solve the aforementioned problems by providing a type of projection exposure apparatus which allows alignment using a TTR type alignment sensor even when the optical projection system is used for an imaging light beam (illuminating light for exposure) having a shorter wavelength. Another object or purpose is to provide a type of projection exposure apparatus with a high resolution and a high alignment precision.

The present invention provides a type of projection exposure apparatus in which, when using illumination light of a first wavelength for exposure, an image is exposed onto a photosensitive substrate through an optical projection system to provide the pattern for mapping on a mask. The optical projection system has a first optical imaging system for forming an intermediate image of the mapping pattern, a first mirror for deflecting an imaging light beam from the first optical projection system, and a second optical imaging system which condenses an imaging light beam deflected by the first mirror to form an image of the mapping pattern on the photosensitive substrate.

Aberration correction is performed for the first optical imaging system and the second optical imaging system with respect to a first wavelength. A second mirror is placed near the first mirror for correcting at least a portion of the chromatic aberration that takes place in the first and second optical imaging systems with respect to a second wavelength different from the first wavelength for exposure. A position detection system makes use of a light beam at the second wavelength or at a nearby wavelength to detect a positional relationship between the prescribed pattern on the mask and the prescribed pattern on the photosensitive substrate. The first and second optical imaging systems and the second mirror are used for this detection.

According to the present invention, the first optical imaging system has a second mirror which is different from the first mirror. The second mirror is placed near the location at which the intermediate image of the imaging light beam at the first wavelength, for exposure, is formed. The light beam at the second wavelength is used for alignment and is deflected by the second mirror. The second wavelength is different from the first wavelength. As a result, at least a portion of the chromatic aberration generated in the projection optical system with respect to the second wavelength, such as the chromatic aberration in the axial direction (a difference in the focal direction) at the imaging position near the photosensitive substrate, can be corrected.

Divergence of the light beam at the first wavelength is small near the location at which the intermediate image at the first wavelength is formed. Consequently, it is easy to arrange the second mirror, providing aberration correction, at the second wavelength outside the optical path of the imaging light beam at the first wavelength. Even when the first wavelength becomes shorter, therefore, an adverse influence on the aberration state of an imaging light beam at the first wavelength is unlikely. It is possible to make the aberration correction for the alignment light beam at the second wavelength. Also, by arranging the position detection system, which uses the second wavelength or a nearby wavelength, to detect the positional relationship between the prescribed pattern on its mask and the prescribed pattern on its photosensitive substrate, it is possible to realize alignment using the TTR type alignment sensor with very high precision.

Plane mirrors having reflective surfaces parallel to each other may be used as the first and second mirrors.

It is preferred that at least one of the first and second optical imaging systems contains a reflective optical part for reflecting the imaging light beam.

The optical imaging system projects the image of a portion of the mapping pattern on its mask onto a photosensitive substrate. The mask and its photosensitive substrate are scanned synchronously with respect to the optical imaging system. In this way, the transfer pattern on the mask is mapped successively onto the photosensitive substrate. The projection exposure apparatus, therefore, is of a scanning exposure type.

DESCRIPTION OF THE PREFERRED EMBODIMENTS

Figure 1:
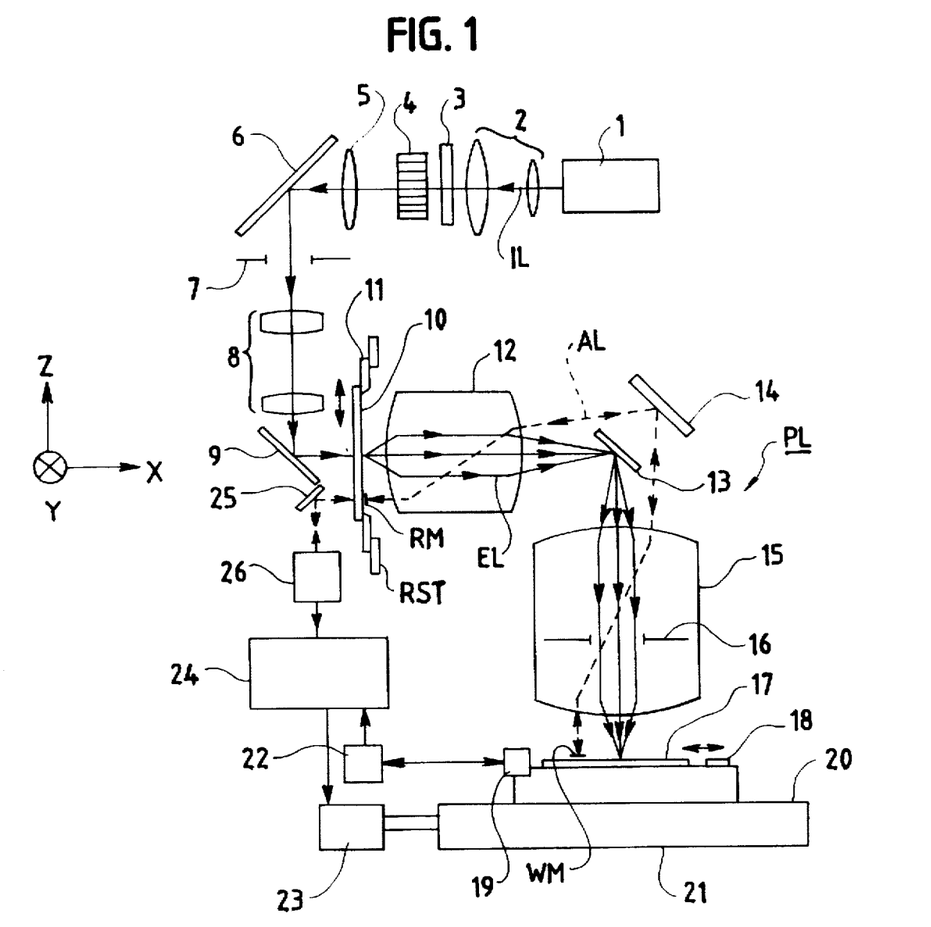
FIG. 1 is a schematic illustration of a first embodiment of a projection exposure apparatus according to the present invention.

FIG. 1 shows one example of the projection exposure apparatus. Illuminating light IL at a first wavelength is emitted from an exposure light source unit 1. An excimer laser, providing light having a wavelength of 248 nm or 193 nm may be used as the light source unit. The illuminating light goes through a shaping lens 2, an interference filter (etalon) 3, an optical integrator 4 formed by a fisheye lens, for example, a relay lens 5, a mirror 6, a field stop (reticle blind) 7, a condenser lens 8, and a mirror 9. The illuminating light is irradiated on a reticle 10. Imaging light beam EL, which is transmitted through the reticle 10 and diffracted, is incident on first imaging optical system 12 in the front section of the projection optical system PL in this example. An intermediate image of the pattern of the reticle 10 is formed in close proximity to the reflective surface of a first mirror 13. Subsequently, the imaging light beam EL reflected by the first mirror 13 is incident to a second imaging optical system 15 in the rear section of the projection optical system PL. Finally, an image, reduced by a projecting magnification rate β (β may be ¼, 1.5, etc.), of the pattern formed on the reticle 10 is projected on a wafer 17.

An aperture stop 16 is arranged on the optical Fourier transform plane ("pupil plane") of the second imaging optical system 15. The reticle 10 is held by reticle holder 11 on the "object plane" of the projection optical system PL. Wafer 17 is held by a sample table 20 on the "image plane" of the projection optical system PL. Of course, for the projection optical system PL, the aberration correction is optimized with respect to the first wavelength (the exposure wavelength).

A coordinate system will now be explained. In this system, the X-axis is defined as being perpendicular to the pattern forming plane of the reticle 10. On a plane perpendicular to the X-axis, the Z-axis is defined as parallel to the plane of the paper in FIG. 1. The Y-axis is defined as perpendicular to the plane of the paper in FIG. 1.

Near the first mirror 13, a second mirror 14 is arranged to correct for the chromatic aberration of the projection optical system PL with respect to the alignment light beam AL. The alignment light beam is provided at a second wavelength which is different from the first wavelength (the exposure wavelength). The second mirror 14 is arranged to form an imaging relationship between the reticle 10 and the wafer 17 at the second wavelength.

When a light beam is assumed to have a wavelength near 600 nm for use as an alignment light beam AL, since the refractive index of the refractive material (lens) in the projection optical system PL for the second wavelength is smaller than that for the first wavelength, the refractive power is reduced.

Consequently, the intermediate image of the pattern on the reticle 10 at the second wavelength formed by the first imaging optical system 12 is at a position farther from the reticle 10 (in the +X direction) than the position of the intermediate image formed for the first wavelength (near the surface of first mirror 13). The intermediate image at the second wavelength is formed almost on the surface of the second mirror 14.

The intermediate image at the aforementioned first wavelength is imaged again by the second imaging optical system 15, and the pattern of the reticle 10 is transformed onto the wafer 17. However, since chromatic aberration also takes place in the second imaging optical system 15 at the second wavelength, the imaging position at the second wavelength becomes farther away, in the +Z direction, from the wafer 17 than the imaging position at the first wavelength (the position corresponding to first mirror 13). The imaging position almost corresponds to the second mirror 14. Consequently, in this example, by setting second mirror 14 at the optimum position for correcting for the chromatic aberration in the first imaging optical system 12 and the second imaging optical system 15 at the second wavelength, it is possible to realize an imaging relationship between reticle 10 and wafer 17 for the second wavelength.

In the −X direction of the reticle 10, by setting mirror 25 for alignment and a TTR type alignment optical system 26 with a light beam at the second wavelength or a nearby wavelength as alignment light beam AL, it is possible to directly detect the positional relationship between an alignment mark RM on the reticle 10 and an alignment mark WM on the wafer 17.

A conventional chromatic aberration correction optical system for a TTR type alignment sensor is arranged, for example, near the aperture stop 16 in the second imaging optical system 15. This correction optical system is, in other words, arranged near the pupil plane of the projection optical system (the Fourier transform plane with respect to the pattern plane of the reticle). It can be seen from FIG. 1 that, on the pupil plane of the projection optical system, the imaging light beam EL and the alignment light beam AL are superimposed. The chromatic aberration correction is performed only for the alignment light beam AL. It is difficult to realize chromatic aberration correction so that a bad influence on imaging light beam EL is avoided.

In this example, in the optical path of the projection optical system PL, at the position of the intermediate image (near first mirror 13), the imaging light beam EL and the alignment beam AL are separated spatially. It is possible to make chromatic aberration correction for alignment light beam AL without any adverse influence on imaging light beam EL.

Of course, if the imaging field of the intermediate image formed near the first mirror 13 is too large, then it is necessary that first mirror 13 be large. Alignment light beam AL, therefore, might be eclipsed by the first mirror 13. Consequently, it is preferred that the illuminating region for reticle 10 be restricted by the reticle blind 7 conjugated to reticle 10. The imaging field for the intermediate image, therefore, will not be very large.

As shown in FIG. 1, the second mirror 14 is arranged parallel to the first mirror 13. However, the orientation of the second mirror 14 is not limited in this way; any other appropriate orientation can be adopted. Since the second mirror 14 is arranged at a position nearly conjugate to wafer 17, even when its direction is slightly changed, there is no significant change in the imaging relationship between the reticle 10 and the wafer 17. It is still possible, however, to change the angle of incidence of the alignment light beam AL on the wafer 17. It is also possible that the alignment mark on the wafer 17 will be detected in a certain defocused state. If the incident angle of the alignment light beam AL on the wafer 17 is a right angle, however, then it is possible to minimize a detection error which is accompanied by defocusing.

A sample table 20 is carried on a wafer stage 21. A motor or another driving system 23 is used to move the wafer stage in the Z-direction or to tilt the stage. The stage 21 can make the wafer 11 move stepwise in the X-direction and the Y-direction for positioning. On the other hand, the reticle holder 11 is provided on the reticle stage RST. The reticle stage RST is movable in the Y-direction and the Z-direction, and is rotatable in order to properly position the reticle 10. A mirror 19 is arranged on a sample table 20. The position of the mirror is measured by a laser interferometer 22. The measurement result is fed to a main control unit 24. Based on the measurement result, the main control unit 24 controls the operation of the drive unit 23. It is also possible to have a reference mark part 18, which has reference marks formed on it, arranged on the sample table 20. The reference marks can be used to perform the baseline checking of the alignment optical system 26.

In the projection exposure apparatus described above, the alignment and the baseline aquisition have the same sequence as that in a conventional projection exposure apparatus. Consequently, an explanation of the alignment and the baseline acquisition operations is omitted. Also, in this projection exposure apparatus, since an alignment optical system 26 with superior measurement reproducibility is adopted, it is also possible to omit the baseline checking step.

In the embodiment shown in FIG. 1, a reticle holder 11 is fixed during exposure. However, it is also possible to use the so-called step-and-scan type projection exposure apparatus. In such an apparatus, the reticle stage RST and the wafer stage 21 are moved synchronously in the Z-direction during exposure. In this case, alignment between the alignment mark RM and the alignment mark WM is carried out by moving the reticle stage RST so that the alignment mark RM is moved directly below the mirror 25 and the alignment optical system 26.

Figure 3A:
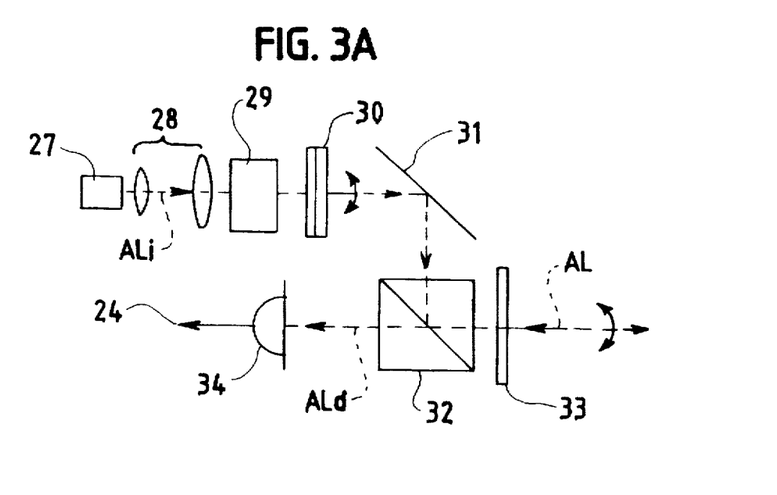
FIG. 3(A) is an enlarged view illustrating an example of an alignment optical system using a TTR type alignment sensor such as that shown in FIG. 1.

FIG. 3(A) illustrates a preferred construction of the alignment optical system 26. In FIG. 3(A), detection light beam ALi emitted from the laser light source 27 (which may be a He-Ne laser, a semiconductor laser, etc.), passes through a shaping optical system 28 and is periodically deflected by an acoustooptical device ("AOD") 29. The light beam then passes through an optical path having a cylindrical lens 30 and a mirror 31 and is incident upon a polarizing beam splitter 32. The detection light beam ALi becomes S-polarized with respect to the polarizing beam splitter 32 and is reflected almost 100% so as to become the alignment light beam AL. Subsequently, the alignment light beam AL is deflected by the mirror 25, shown in FIG. 1, and is irradiated toward the alignment mark RM on the reticle 10. After being emitted from the polarizing beam splitter 32, due to the function of the quarter-wave plate 33, the alignment light beam AL becomes circularly polarized and is irradiated on the reticle 10. Returning light ALd becomes P-polarized with respect to the polarizing beam splitter 32. The light beam is transmitted almost entirely (nearly 100%) through the beam splitter and is incident upon a photodiode or another photodetector 34.

Figure 3B:
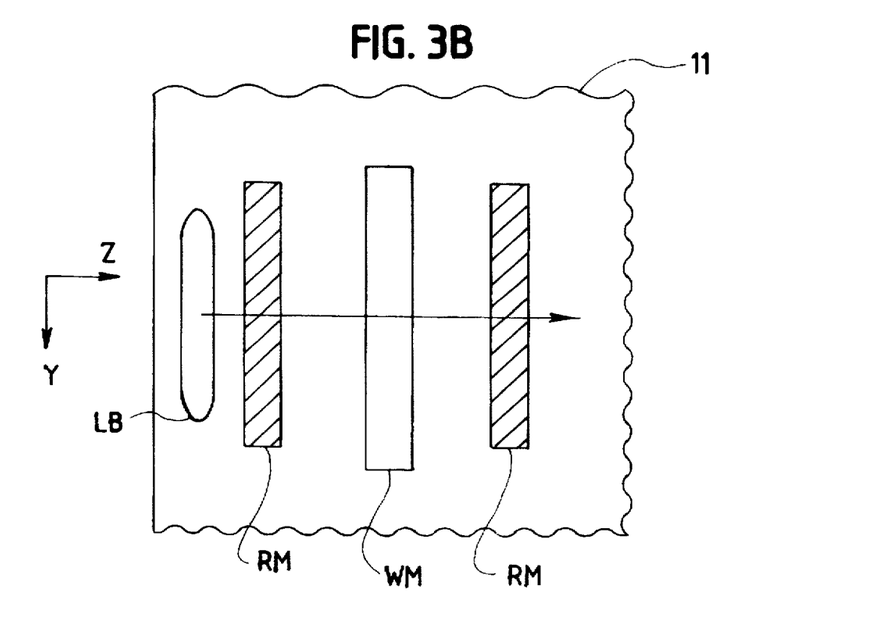
FIG. 3(B) is an enlarged plan view illustrating the position relationship between an alignment mark on a reticle and an alignment mark on a wafer.

FIG. 3(B) shows the positional relationship between the alignment mark RM on the reticle 10 and the alignment mark WM on the wafer 11 (or, more correctly, the projection image of the alignment mark WM on the reticle 10). Due to the function of the cylindrical lens 30, near the alignment mark RM, the alignment light beam AL becomes a sheet-like beam LB. Due to the function of the AOD 29, the light beam is scanned in the Z-direction as seen in FIG. 3(B). Consequently, the sheet-like beam LB scans the alignment mark RM, the alignment mark WM, and then the alignment mark RM again, in that order. Returning light ALd is received by the photodetector 34 represented in FIG. 3(A). Based on a variation in the light intensity received by the photodetector 34, it is possible to measure the position relationship between the alignment mark RM on the reticle 10 and the alignment mark WM on the wafer 11. The photoelectric signal from the photodetector 34 is input to the main control unit 24, shown in FIG. 1, to analyze the photoelectric signal and measure the positional relationship inside the main control unit 24.

In the aforementioned example of the alignment optical system 26, in order to simplify the explanation, the alignment optical system 26 is shown as providing alignment one-dimensionally, in only one direction. However, in an actual projection exposure apparatus, it is necessary to measure the position in two directions (two-dimensionally) rather than in one direction. Consequently, multiple alignment optical systems 26 (in the Y-direction and the Z-direction) are provided. One alignment optical system 26 may alternatively itself allow two-dimensional measurement.

Figure 4:
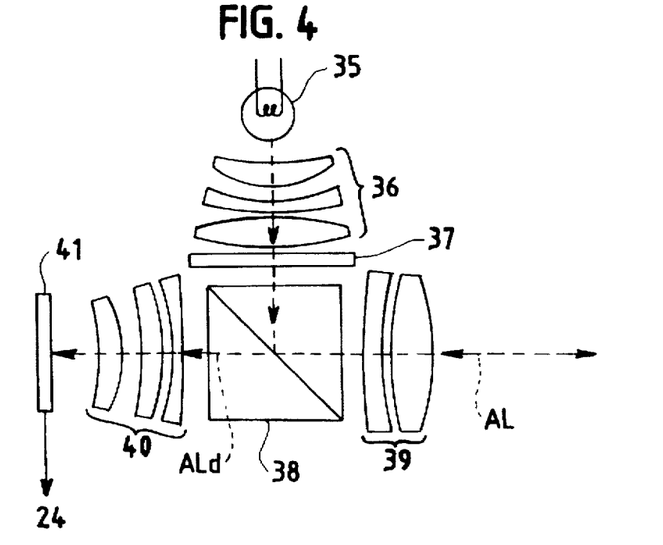
FIG. 4 is an enlarged illustration of another use of the TTR type alignment sensor shown in FIG. 1.

FIG. 4 illustrates another embodiment of the alignment optical system 26. This embodiment adopts the image sensor. In FIG. 4, a halogen lamp, or another broadband light source, is used for the light source 35. The broadband light beam passes through a condenser lens 36 and a sharp-cut filter 37 and is incident upon a beam splitter 38. The light beam reflected by the beam splitter 38 becomes an alignment light beam AL. When the chromatic aberration correction for the alignment light beam AL, using second mirror 14, is not good for the light beam at a wavelength other than the second wavelength, a wavelength selecting filter (bandpass filter) is arranged so that the wavelength range of the alignment light beam AL is limited so as to remain near the second wavelength.

After passing through a relay lens 39, the alignment light beam AL from the beam splitter 38 is bent by a mirror 25, as shown in FIG. 1, and irradiated near the alignment mark RM on the reticle 10. The alignment light beam AL transmitted through the reticle 10 reaches the wafer 17. Subsequently, the light beam returns from the wafer 17 and the reticle 10. By the imaging lens 40, returned light ALd, transmitted through beam splitter 38 shown in FIG. 4, forms both the image of the alignment mark RM on the reticle 11 and the image of the alignment mark WM on the wafer 11 on a CCD or similar pickup element 41.

The image signal (image intensity distribution) output from the pickup element 41 is sent to a main control unit 24 such as that shown in FIG. 1. Based on this signal, the position relationship between the alignment mark RM on the reticle 11 and the registration mark WM on the wafer 11 is measured. Also, marks which are the same as those shown in FIG. 3(B) may be used for the various marks used in the other examples of the alignment optical system 26. Depending on the processing ability of the image processing unit in the main control unit 24, it is possible to detect marks having various shapes. For example, it is possible to make use of a box-shaped mark or other two-dimensional measurement marks to perform simultaneous detection of positions in two directions.

The second embodiment of the projection exposure apparatus of the present invention will now be explained with reference to FIG. 2. In this example, the present invention is adopted in a step-and scan type projection exposure apparatus. As many of the signs in FIG. 2 correspond to those in FIG. 1, their detailed explanation is omitted.

Figure 2:
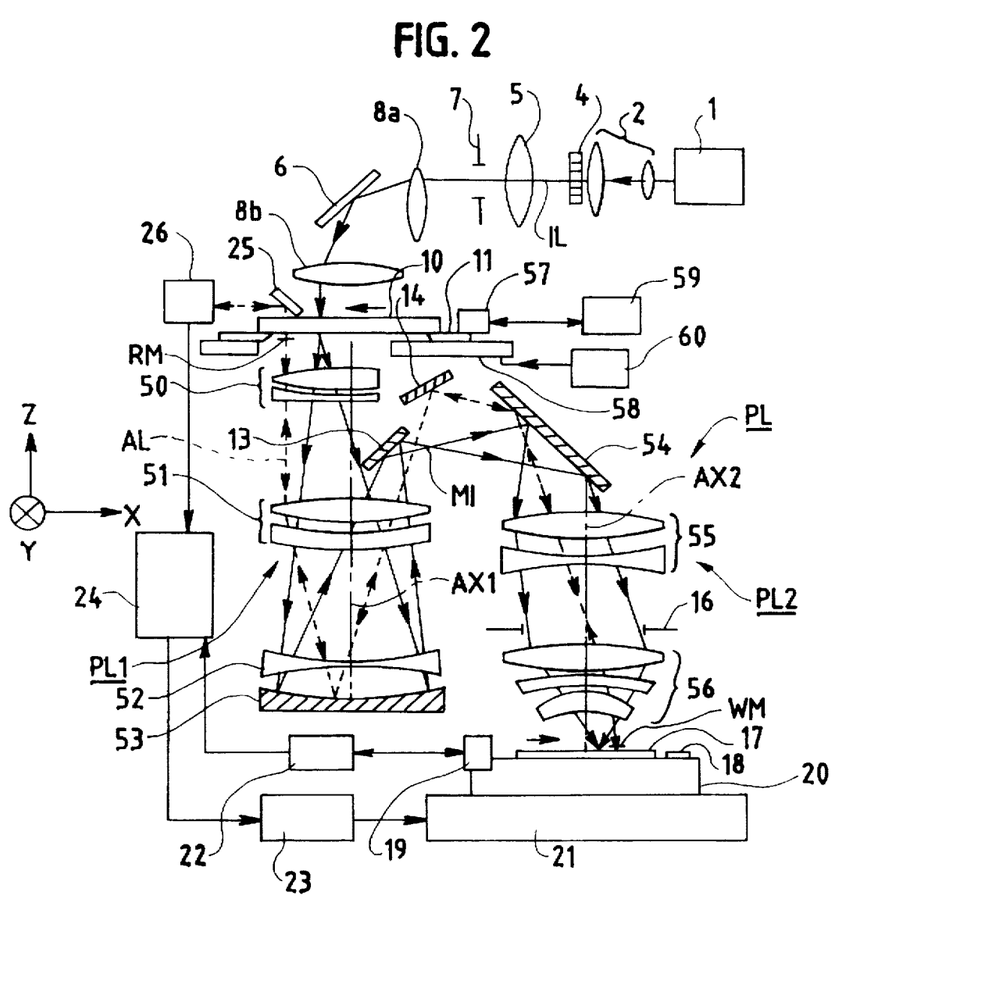
FIG. 2 is a schematic illustration of a second embodiment of the projection exposure apparatus.

FIG. 2 is a schematic illustration of the projection exposure apparatus. In FIG. 2, as in the first embodiment, illuminating light IL is emitted from exposure light source unit 1 such as an excimer laser having a wavelength of 248 nm or 193 nm. The light goes through a shaping lens 2, an optical integrator 4, a relay lens 5, a reticle blind 7, a first condenser lens 8a, a mirror 6, and a second condenser lens 8b. The light is irradiated on the reticle 10. A slit-like illuminating region is formed on the reticle 10. Imaging light beam EL, transmitted through the reticle 10, is formed and refracted incident upon first imaging optical system PL1 forming the front section of the projection optical system PL in this example.

The first imaging optical system PL1, in this embodiment, is an optical system containing a concave mirror 53 as a reflective optical member. In this system, the Z-axis is defined as parallel to optical axis AX1 of the first imaging optical system PL1. On a plane perpendicular to the Z-axis, the X-axis is defined as parallel to the plane of the paper in FIG. 2. The Y-axis is defined as perpendicular to the plane of the paper in FIG. 2.

In the first imaging optical system PL1, an imaging light beam EL is incident upon and refracted by a first lens group 50, a second lens group 51, and a third lens group 52. The beam is then reflected by a concave mirror 53 and, again, is incident upon and refracted by the third lens group 52 and the second lens group 51. The beam is emitted from the imaging optical system PL. After the imaging light beam EL is reflected and deflected by the first mirror 13, it forms the intermediate (hollow or concave) image MI of the pattern formed on the reticle 10 near the first mirror 13.

In addition, after the imaging light beam EL is reflected by the mirror 54, it is incident upon the second imaging optical system PL2 in the rear section of the projection optical system PL. In the second imaging optical system PL2, the imaging light beam EL passes through a first lens group 55, an aperture stop 16, and a second lens group 56 and, due to the refractive functions of these optical elements, the image of the pattern of the reticle 10 is projected on the wafer 17.

The reticle 10 is held by a reticle holder 11 on the "object plane" of the projection optical system PL. With a reticle drive unit 60, the reticle holder 11 can be scanned in the X-direction on the reticle stage 58 so as to enable position adjustment in the XY plane. Subsequently, the position of the reticle holder 11 is measured by an interferometer mirror 57 and a reticle interferometer 59. The measurement results are fed to the main control unit 24. Based on the measurement results, the main control unit 24 controls the reticle drive unit 60. Exposure on the wafer 17 is performed while the reticle stage 58 and the wafer platform 21 are scanned synchronously to each other as a result of instructions from the main control unit 24. More specifically, if the projecting magnification of the projection optical system PL is β (β may be ¼, ⅕, etc.), synchronized to scanning of the reticle 10 in the −X direction (or the +X direction) at a speed of VR, then the wafer 17 is scanned in the +X direction (or the −X direction) at a speed of β VR.

The wafer 17, held on the sample table 20, is kept on the image plane of the projection optical system PL. The projection optical system PL is then subjected to aberration correction so that it is optimized with respect to the first exposure wavelength.

Usually, in a projection optical system PL containing a concave mirror such as the mirror 53, the chromatic aberration correction is better than that when the projection optical system is made up only of lenses. Consequently, in this example, it is possible to get rid of an interference filter 3 forming a monochromatic light-forming member. As a result, the first exposure wavelength may not be monochromatic. Consequently, it is possible to make use of a bright-line (spectrum) lamp, with poorer monochromaticity than a laser, as a light source.

In this embodiment, the second mirror 14 is arranged in close proximity to the first mirror 13, shown in FIG. 2, to correct for the chromatic aberration of the projection optical system PL for the alignment light beam AL at a second wavelength which is different from the first wavelength (exposure wavelength). An imaging relationship between the reticle 10 and the wafer 17 for the second wavelength can be formed. It is possible to detect directly the positional relationship between the alignment mark RM on the reticle 10 and the alignment mark WM on the wafer 17 by arranging the mirror 25 for alignment and the alignment optical system 26 using a light beam at a second or nearby wavelength as the alignment light beam AL above the alignment mark RM of the reticle 10.

The alignment light beam AL from the alignment optical system 26 is reflected by the mirror 25 and irradiated, in close proximity, to the alignment mark RM of the reticle 10. After being transmitted through the reticle 10, the alignment light beam AL goes through the first imaging optical system PL1, the mirror 14, the mirror 54, and the second imaging optical system PL2, and is irradiated in close proximity to the alignment mark WM on the wafer 17. Under the alignment light beam AL, the reticle 10 and the wafer 17 are nearly conjugate to each other. The alignment light beam AL reflected from the wafer 17 travels backward with respect to the incident optical path to the alignment optical system 26.

In the second embodiment, the alignment optical system 26 may also make use of what is shown in FIGS. 3 and 4 in the same way as in the first embodiment.

In the first and second embodiments, the second mirror 14 corrects only the chromatic aberration in the axial direction and at the second wavelength between the reticle 10 and the wafer 17. However, it is also possible to correct the chromatic aberration in the lateral direction (chromatic aberration of magnification) by appropriate arrangement of the second mirror 14 and appropriate construction of the projection optical system PL.

Even when the chromatic aberration in the axial direction cannot be completely compensated for, as correction for the chromatic aberration can be made to a certain degree, it is possible to realize the same alignment of the TTR type alignment sensor as that described above. In this case, the position of the image of the pattern on the reticle 10 at the first wavelength (the best-focus position) and the position of the image of the pattern on the reticle 10 at the second wavelength (alignment wavelength) are different. As long as the difference is within a few μm, it is possible to solve the problem of the difference in the imaging position between the first wavelength and the second wavelength by moving the sample table 20 up or down to change the position of wafer 11 in alignment and in exposure.

In the projection optical system PL carried on the projection exposure apparatus of this example, the projecting magnifications of the first imaging optical system and the second imaging optical system may be selected as desired. Of course, the projection magnification between the reticle 10 and the wafer 17 can also be selected to have any value. For the projection optical system PL, it is only required to have a good correction for the aberration between the recticle 10 and the wafer 17. Problems are not present even when an aberration between the reticle 10 and the intermediate image MI or between the intermediate image MI and the wafer 17 remains.

In the aforementioned embodiments, the first mirror 13 and the second mirror 14 are shown as separate members. However, it is also possible to adopt an integrated structure including formation of the first and second mirrors by polishing different surfaces on a single member such as glass with a low expansion coefficient or rate. This method is preferred because the imaging light beam EL and the alignment light beam AL have the same variation with respect to any change caused by alignment errors due to thermal variation, etc., so that their baseline variations cancel each other. In another method, although the first and second mirrors are not formed on a single member, they are nevertheless held by a single member (made of a metal with low expansion rate) so that their baseline variations, caused by thermal variation, can cancel each other out.

Although the first and second mirrors are both plane mirrors in the aforementioned embodiments, curved mirrors are nevertheless preferred for aberration correction. No problem exists in adopting curved mirrors.

Also, the present invention is not limited to the aforementioned embodiments. As long as the main points of the present invention are observed, various other constructions may also be adopted.

The present invention includes a second mirror placed near the first mirror for deflecting the light beam at the first wavelength for exposure. The purpose of the invention is to correct, at least partially, the chromatic aberration generated in the first and second imaging optical systems with respect to the second wavelength for position detection. The second wavelength, as noted above, is different from the first wavelength. A position detection unit is arranged to detect the positional relationship between the predetermined pattern on the mask and the predetermined pattern on the photosensitive substrate by the first optical imaging system, the second imaging optical system and the second mirror by using a light beam at the second or nearby wavelength. In this way, even when the first wavelength for exposure becomes shorter, since the second mirror is outside of the optical path of the light beam at the first wavelength, it is still possible to perform good alignment with the TTR type alignment sensor using the second wavelength. The light beam at the first wavelength is not influenced.

When the first and second mirrors are plane mirrors with reflective surfaces which are arranged parallel to each other, there is a high level of safety. Construction is simple.

When at least one of the first and second imaging optical systems contains reflective optical parts for reflecting the imaging light beam, chromatic aberration correction becomes better than that of imaging optical system using lenses for chromatic aberration correction. Such a construction is appropriate for exposure of fine patterns. Also, the chromatic aberration becomes smaller for the light beam for position detection, and the correction for chromatic aberration becomes easier.

The projection optical system projects the image of a portion of the pattern on the mask onto the photosensitive substrate. The mask and the photosensitive substrate are scanned synchronously to each other with respect to the projection optical system. Consequently, when the pattern on the mask is transferred successively onto the photosensitive substrate, the projection exposure apparatus utilizes a scanning type projection-exposure method. In the projection exposure apparatus, an intermediate image formed by the exposure light beam at the first wavelength becomes smaller, the tolerance range for setting the first and second mirrors becomes larger, and the effects of the present invention become more significant.

The entire disclosure of Japanese Patent Application No. 8-052730, filed on Mar. 11, 1996, and including specification, claims, drawings and summary, is incorporated herein by reference in its entirety.

I claim:

1. A projection exposure apparatus comprising:

a projection optical system which projects an image of a pattern formed on a mask on a substrate, said projection optical system having a first optical system for forming an intermediate image of the pattern, a first mirror disposed near the intermediate image for deflecting a light beam from said first optical system and a second optical system for condensing the light beam from said first mirror and forming the image of the pattern on said substrate, said first optical system and said second optical system being subject to an aberration correction with respect to a first wavelength for exposure;

a second mirror disposed near said first mirror and which corrects at least a portion of a chromatic aberration generated in said first optical system and said second optical system with respect to a second wavelength different from said first wavelength; and a detecting system which detects a positional relationship between a mark of the mask and a mark of the substrate with a light beam at said second wavelength through said first optical system, said second optical system, and said second mirror.

2. An apparatus according to claim 1, wherein said first mirror and said second mirror are plane mirrors with reflective surfaces which are arranged parallel to each other.

3. An apparatus according to claim 1, wherein at least one of said first optical system and said second optical system includes a reflective optical member.

4. An apparatus according to claim 1, wherein the pattern formed on the mask is transferred to the substrate by moving the mask and the substrate synchronously.

5. An apparatus according to claim 2, wherein at least one of said first optical system and said second optical system includes a reflective optical member.

6. An apparatus according to claim 2, wherein the pattern formed on the mask is transferred to the substrate by moving the mask and the substrate synchronously.

7. An apparatus according to claim 3, wherein the pattern formed on the mask is transferred to the substrate by moving the mask and the substrate synchronously.

8. An apparatus as defined in claim 1, wherein said light beam at said second wavelength is directed by said first optical system, said second optical system and said second mirror to said mark of the mask and said mark of the substrate.

9. An apparatus as defined in claim 8, wherein said first optical system includes a concave mirror as a reflective optical member for reflecting both a light beam at said first wavelength and said light beam at said second wavelength.

10. An apparatus as defined in claim 8, wherein said second optical system includes at least one lens group through which both a light beam at said first wavelength and said light beam at said second wavelength pass.

11. An apparatus as defined in claim 9, wherein said second optical system includes at least one lens group through which both said light beam at said first wavelength and said light beam at said second wavelength pass.

12. An apparatus as defined in claim 2, wherein said light beam at said second wavelength is directed by said first optical system, said second optical system and said second mirror to said mark of the mask and said mark of the substrate.

13. An apparatus as defined in claim 12, wherein said first optical system includes a concave mirror as a reflective optical member for reflecting both a light beam at said first wavelength and said light beam at said second wavelength.

14. An apparatus as defined in claim 12, wherein said second optical system includes at least one lens group through which both a light beam at said first wavelength and said light beam at said second wavelength pass.

15. An apparatus as defined in claim 14, wherein said second optical system includes at least one lens group through which both said light beam at said first wavelength and said light beam at said second wavelength pass.

16. A projection exposure apparatus comprising:

a first optical system for forming an image of a pattern formed as a mask on a substrate, a first mirror for deflecting a light beam from said first optical system, a second optical system for condensing the light beam from said first mirror and forming the image of the pattern on said substrate, said first optical system and said second optical system being subject to an aberration correction with respect to a first wavelength for exposure;

a second mirror which corrects at least a portion of a chromatic aberration generated in said first optical system and said second optical system with respect to a second wavelength different from said first wavelength; and a detecting system which detects a positional relationship between a mark of the mask and a mark of the substrate with a light beam at said second wavelength through said first optical system, said second optical system, and said second mirror.

17. An apparatus according to claim 16, wherein said first mirror and said second mirror are plane mirrors with reflective surfaces which are arranged parallel to each other.

18. An apparatus according to claim 16, wherein at least one of said first optical system and said second optical system includes a reflective optical member.

19. An apparatus according to claim 16, wherein the pattern formed as the mask is transferred to the substrate by moving the mask and the substrate synchronously.

20. An apparatus according to claim 17, wherein at least one of said first optical system and said second optical system includes a reflective optical member.

* * * * *